(12) United States Patent
Balazs et al.

(10) Patent No.: US 8,066,417 B2
(45) Date of Patent: Nov. 29, 2011

(54) LIGHT EMITTING DIODE-LIGHT GUIDE COUPLING APPARATUS

(75) Inventors: Laszlo Balazs, Godollo (HU); Istvan Maros, Budapest (HU); Istvan Peter Bakk, Pest (HU)

(73) Assignee: General Electric Company, Schenectady, NY (US)

( * ) Notice: Subject to any disclaimer, the term of this patent is extended or adjusted under 35 U.S.C. 154(b) by 32 days.

(21) Appl. No.: 12/549,530

(22) Filed: Aug. 28, 2009

(65) Prior Publication Data

US 2011/0051424 A1 Mar. 3, 2011

(51) Int. Cl.
*F21V 7/04* (2006.01)
(52) U.S. Cl. ........ 362/555; 362/228; 362/294; 362/560; 362/580; 362/581; 385/88; 385/92
(58) Field of Classification Search .................. 362/294, 362/551, 555, 560, 580, 581; 385/88, 92
See application file for complete search history.

(56) References Cited

U.S. PATENT DOCUMENTS

| 4,767,172 | A | 8/1988 | Nichols et al. |
| 5,732,176 | A | 3/1998 | Savage, Jr. |
| 6,832,861 | B2 | 12/2004 | Kragl |
| 7,276,737 | B2 | 10/2007 | Camras et al. |
| 7,279,345 | B2 | 10/2007 | Camras et al. |
| 7,360,924 | B2 * | 4/2008 | Henson et al. ............... 362/241 |
| 7,543,957 | B1 | 6/2009 | Balazs et al. |
| 2004/0114880 | A1 * | 6/2004 | Ebbecke ..................... 385/88 |

* cited by examiner

*Primary Examiner* — Stephen F Husar
(74) *Attorney, Agent, or Firm* — Fay Sharpe LLP

(57) ABSTRACT

Different arrangements for improving the coupling-in efficiency between an LED assembly and a light guide are disclosed. In a first arrangement, a substantially planar end of a light guide is seated on a perimeter wall of a support that encloses a LED assembly, and a reflecting surface enhances coupling efficiency of a light guide. Alternative arrangements use a separate coupler disposed between the LED assembly and the light guide, which coupler has a paraboloid or aspheroid conformation to develop substantially collimated light that is directed into the light guide. The cavity around the LED assembly and within the coupler, may be air or a material having an index of refraction that closely matches the index of refraction of the light guide material.

18 Claims, 5 Drawing Sheets

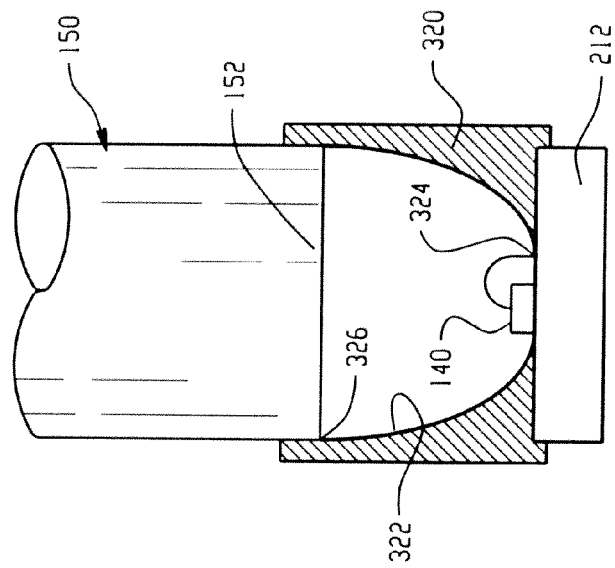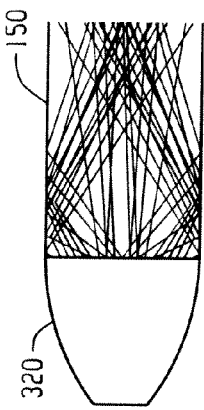
Fig. 7
Fig. 8
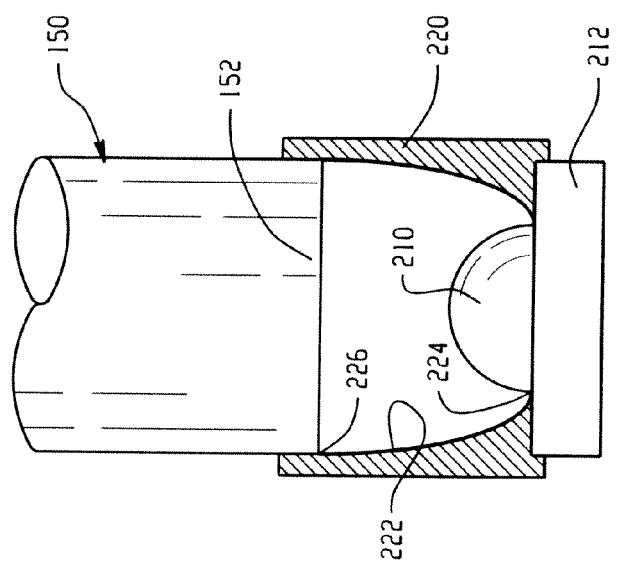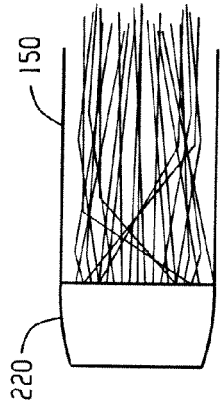
Fig. 5
Fig. 6

LIGHT EMITTING DIODE-LIGHT GUIDE COUPLING APPARATUS

BACKGROUND OF THE DISCLOSURE

The present disclosure relates to a coupling arrangement or coupling apparatus between a light emitting diode (LED) and a light guide, and more particularly, to improving the coupling efficiency between the components. The coupling apparatus in this particular application is a compact fluorescent lamp (CFL), for example, where there is a desire to intermix red color light with white light emitted from the CFL, although the disclosure may find more general application in related environments where a high efficiency or coupling is desired.

Color rendering of saturated red color of a standard CFL can be enhanced by a combination with red light from an LED. For example, commonly owned U.S. Pat. No. 7,543,957 is directed to such an arrangement, the disclosure of which is expressly incorporated herein by reference. High efficiency red LED's are temperature sensitive so there is a need to thermally insulate the LED from the CFL. The noted '957 patent mounts the LED in a base portion of the lamp assembly in order to segregate the thermally sensitive LED from the elevated temperature associated with the CFL. A light guide is employed to convey the red light from the LED in the base portion of the lamp assembly to a region adjacent the discharge tube(s) of the CFL where effective mixing with the white light emitted by the discharge tube(s) is attained.

The higher the in-coupling, transferring, and out-coupling efficiencies of a light guide, the higher the resultant effect on saturated red color rendering of the lamp. Improved efficiencies associated with (i) light entry into the light guide, (ii) along the length of the light guide, and (iii) upon exiting of the light guide, result in more red color intermixing with the white light from the CFL from a particular LED driven at a particular wattage.

In-coupling efficiency is deemed to be the most critical junction in the light path. Geometric incompatibility of the radiation mode of the source (here, the LED) and the guided mode (here, the light guide) indicates that substantial areas for improvement are required. By radiation mode is meant the angular and spatial distribution of light emitted from the LED. Where large light guides are used in conjunction with the light guide (that is where the diameter of a light guide is larger than the size of the LED source and its primary optics), the problem simplifies to matching LED radiation characteristics, usually lambertian, along with the limited acceptance angle or (NA of the light guide). Coupling efficiency is measured as a percentage of the light exiting the light guide relative to the intensity of the light emitted by the LED. Known coupling arrangements range exhibit an efficiency that ranges between 35% to approximately 50%.

Various coupling arrangements are suggested in the prior art. For example, one prior art arrangement provides butt coupling or contact between a polished end of the light guide and an integrated optical arrangement associated with the LED. Alternatively, a cavity or recess is formed around the LED to collect the light into the light guide such as shown and described in U.S. Pat. No. 7,279,345. Still another arrangement uses lens coupling where a special geometry lens, lens holder, etc. are interposed between the LED and the light guide (See, for example, U.S. Pat. No. 5,732,176). Higher coupling efficiencies are attained when compared to the butt coupling arrangement. Still another coupling arrangement is a reflector-type coupling and heretofore the designs are based on classic reflector designs used with incandescent light sources which are not easily incorporated into the LED-light guide environment. Typically, the reflector includes a metallic reflective layer and also uses air as a propagation medium within the reflector Eliminating an air gap between the light source and the light guide is desirable because such a structure would reduce the Fresnel reflections on the LED-air and air-light guide interfaces, and also enhances the application of total internal reflection (TIR) on the reflecting surface.

Consequently, a need exists for improved coupling efficiency, and also consideration of commercialization of such an arrangement that limits the cost to manufacture while providing a repeatable solution for both ease of assembly and consistent results.

SUMMARY OF THE DISCLOSURE

Various arrangements are disclosed for improving a coupling efficiency between a LED light source and a light guide.

In one exemplary embodiment, a light guide has a proximal, substantially planar end positioned adjacent to the LED. A support receives the LED in a central recessed portion and the LED is disposed in facing relation to the planar end of the light guide. The support includes a reflector surface for transferring a high ratio of light from the LED to the light guide. A fixture includes a recess dimension for closely receiving a limited axial extent of a perimeter portion of the light guide.

The fixture includes at least one opening for receiving a power supply lead wires therethrough.

In another exemplary embodiment, a coupler is interposed between the LED and the proximal end of the light guide. The coupler includes one of a parabolic or aspheric inner reflector surface having a narrow first end that at least partially encompasses the LED and a wide, second end that at least partially encompasses the proximal end of the light guide.

The coupler encompasses a periphery of an optical dome (integrated optics) that overlies an LED chip, and preferably encompasses a portion of the substrate on which the LED chip is mounted.

In another arrangement, the first end of the coupler encompasses a bare LED chip and the inner reflector surface extends from a substrate surface in surrounding relation to a perimeter of the chip received on the substrate.

A cavity formed by the inner reflector surface may be filled with air or a gel, where the gel has a refractive index that closely matches the refractive index of the light guide.

In a still further embodiment, the proximal end of the light guide includes a coupler having a parabolic or aspheric-shaped surface that at least partially encompasses the LED and directs collected light toward a wide, second end that merges into a remainder of the light guide.

A primary benefit of the disclosure is the decreased light loss between the LED and associated light guide.

Another benefit resides in the reduced cost of manufacture and assembly.

Still other benefits and features of the disclosure will become more apparent from reading and understanding the following detailed description.

BRIEF DESCRIPTION OF THE DRAWINGS

FIG. 5 is an elevational view partially in cross-section of another preferred coupling arrangement of the LED and light guide.

FIG. 6 is a light ray trace of the embodiment of FIG. 5.

FIG. 7 is an elevational view partly in cross-section of still another optical coupling arrangement.

FIG. 8 is a representative light ray trace of the embodiment of FIG. 7.

DETAILED DESCRIPTION OF THE PREFERRED EMBODIMENTS

Figure 1:
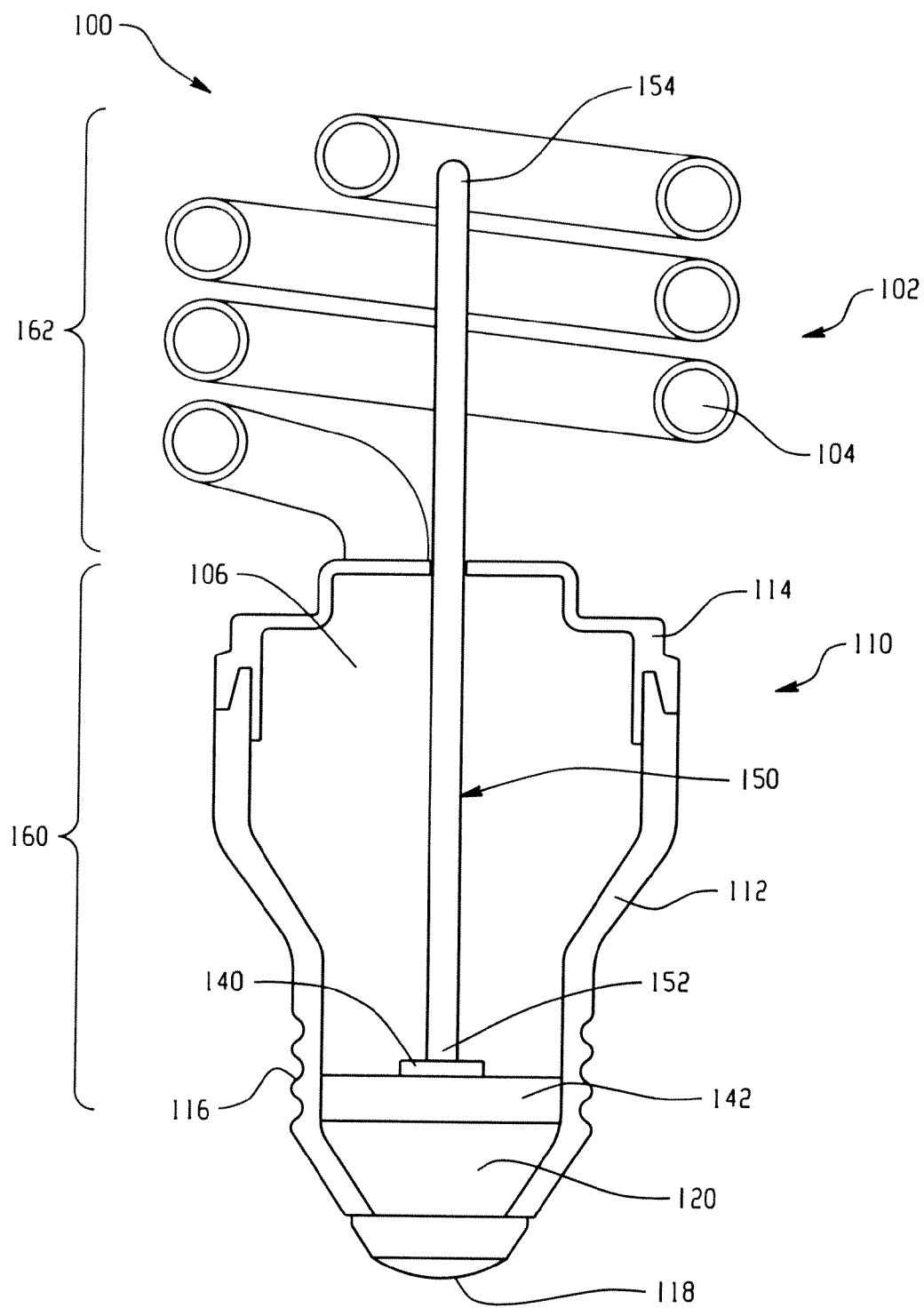
FIG. 1 is an elevational view of a compact fluorescent lamp, LED and light guide lamp assembly with selected portions cut away for ease of illustration.

With reference to the drawings, like reference numerals are used throughout to identify to like components. More particularly, an LED-integrated compact fluorescent lamp assembly includes a low pressure fluorescent discharge lamp 102, which has at least one low pressure discharge tube 104 is shown in FIG. 1. In the depicted embodiment, the CFL assembly has a helical discharge tube which has first and second end portions 106 (only one of which is shown). As is known, the discharge tube radiates white light by bringing a gas fill to a discharge state via an arc between electrodes, one end of each electrode extending at least partially inward into the discharge tube from each end portion 106. A phosphor is provided on the inner surface of the discharge tube to convert the discharge radiation into visible light. The end portions 106 extend into a lamp base 110 that includes a shell 112 closed off at an upper end by collar 114 and at the lower end includes an Edison type threaded portion 116 for threaded engagement with an associated socket (not shown). Of course other connecting arrangements may be provided for mechanically holding and electrically connecting to an associated lamp fitting. The threaded base is a conductive metal that forms one contact with the associated lamp fitting and a central metal eyelet 118 that forms the second contact. The shell 116 and eyelet 118 are separated by an insulating material 120.

Lamp electronics such as a ballast (not shown) are preferably located within the shell of the embodiment of FIG. 1. The ballast supplies the necessary power electronics and circuit conditions such as voltage, current, and wave form to drive or power the compact fluorescent tubes. Alternatively, the ballast may be formed separately and not incorporated into the lamp base, although the integral ballast is preferred. Heat sensitive electronic components of the ballast may also require a heat reflector or shield to protect these components from the heat generated by the discharge lamp.

At least one light emitting diode light source 140 is mounted to a heat sink or support 142 at a location in the base that maximizes the distance from the discharge tube. Preferably the support 142 is formed of a heat conducting material, such as metal, in order to efficiently and effectively transfer heat away from the LED light source. Moreover, the LED is preferably a red light emitting LED for mixing with the white light emitted by the discharge lamp. A light guide 150 has a first or proximal end 152 adjacent the LED 140 and support 142, and a second or distal end 154 that preferably terminates adjacent the discharge tube. As will be appreciated, the light guide has a first or lower region disposed within the shell that preferably does not permit the light to escape through a sidewall of the light guide. For example, the light is transmitted through total internal reflection (TIR) as it passes along an axial length of the light guide portion disposed within the shell and represented by reference numeral 160. In the region where the light guide exits the shell, the second or upper section 162 of the light guide permits the light to be distributed along this longitudinal extent and results in good color mixing with the white light emitted from the discharge tube.

With continued reference to FIG. 1, and additional reference to FIGS. 2-4, a first exemplary embodiment of a coupling arrangement between the LED and the first or proximal end 152 of the light guide will be described in greater detail. The LED 140 is located in support 170 that preferably includes a central recess 172 so that a perimeter edge or wall 174 of the support extends axially outwardly a greater dimension than an axial dimension of the LED chip received in the central portion. The support is received in a heat sink 180 (which may be the same as support/heat sink 142) and that also includes a recess 182 having depth and width dimensions that easily accommodate the support 140 and fixture 190. Fixture 190 has an inner diameter that closely matches the outer diameter of the proximal end of 152 of the light guide and has an outer dimension 194 that closely fits within the recess 182. The height of the fixture 190 closely conforms to that of the recess 182 in the heat sink, and is dimensioned so that the cavity formed by inner opening 192 in the fixture accommodates the support 170 (with the LED chip therein) and also a limited axial length of the proximal end 152 of the light guide.

The diameter of the light guide is substantially greater than that of the chip, for example, the lateral dimension of the LED 140 is approximately 1/10 of the light guide diameter or lateral dimension of the proximal substantially planar end 152 of the light guide. Moreover, the substantially planar terminal end of the light guide preferably engages an upper surface of the perimeter wall 174 of the support. By forming an interior recess 172 of the support as a white surface or other similarly reflective surface, light emitted by the LED that does not proceed directly into the light guide, will be directed by the reflective surface toward the light guide and thereby enhance the coupling efficiency between the LED and the light guide. The limited axial receipt of the proximal end 152 of the light guide within the fixture 190 will further promote directing light emitted by the LED into the end of the light guide, i.e., enhancing optical efficiency.

The remaining volume or cavity within recess 172 is preferably filled with air. It is also contemplated that a material, such as a gel, having a refractive index that closely matches that of the light guide could be used to fill the remainder of the recess.

Figure 3:
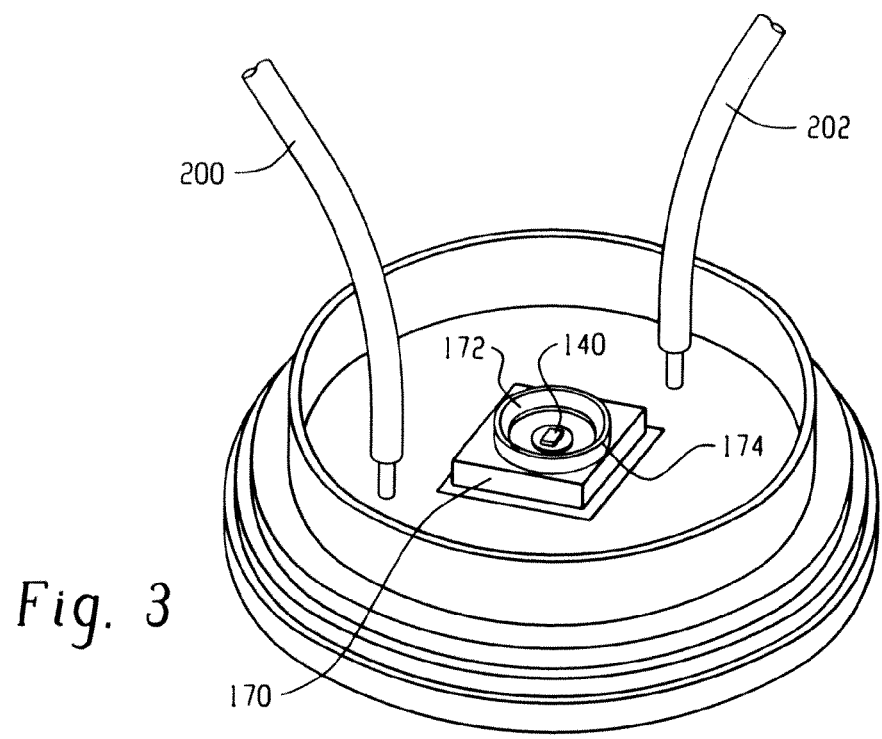
FIG. 3 is a perspective view of portions of the assembly of FIG. 2.

Power supply lead wires 200, 202 are shown in FIG. 3 prior to insertion of the fixture 190 into the assembly. As evidenced in FIG. 4, openings 204, 206 are provided through the fixture to accommodate the power supply wires. In this manner, the light guide extends from a central portion of the fixture and the power supply wires are located at a spaced location from the light guide.

Figure 2:
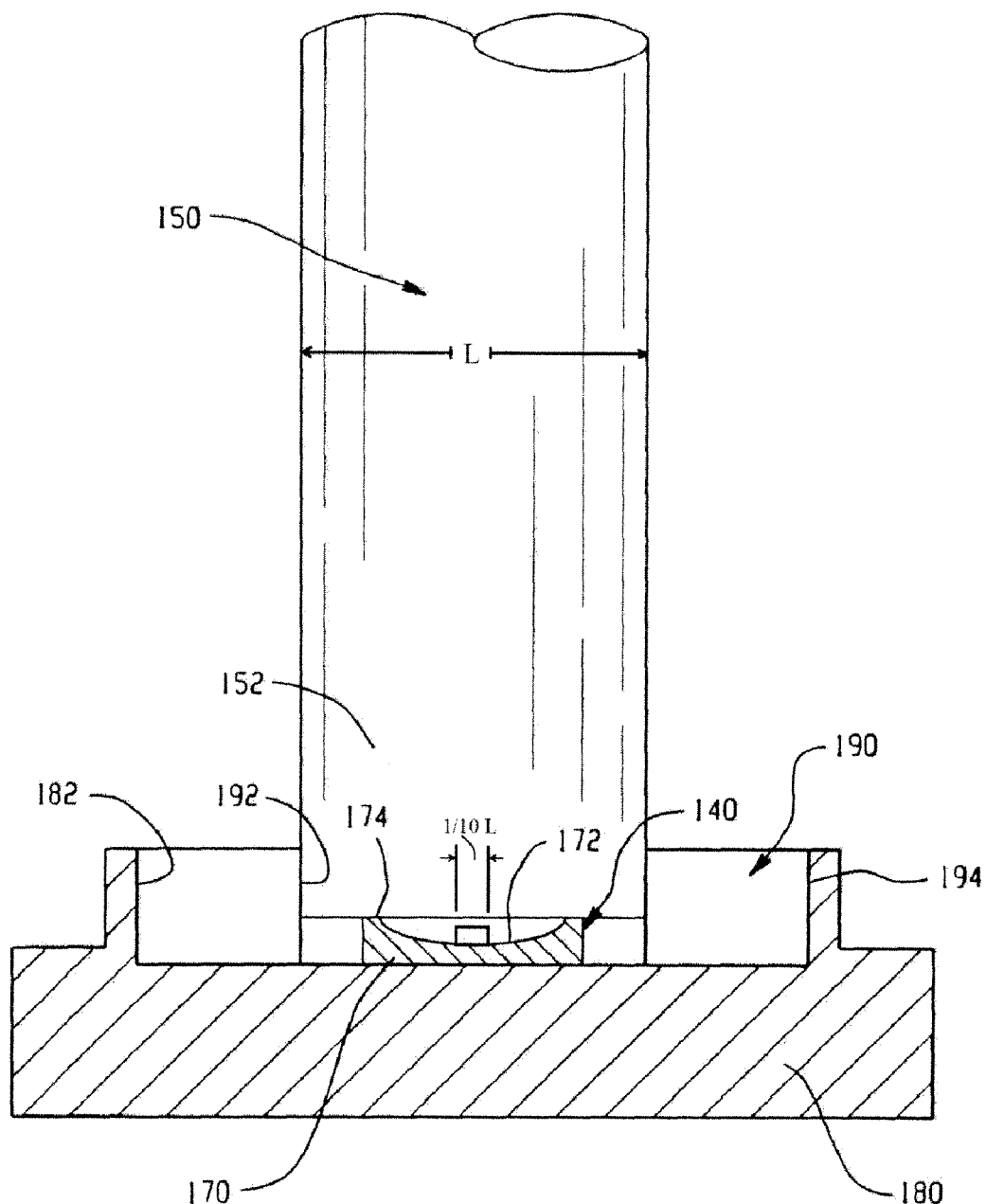
FIG. 2 is a cross-sectional view of a first preferred coupling arrangement.
Figure 4:
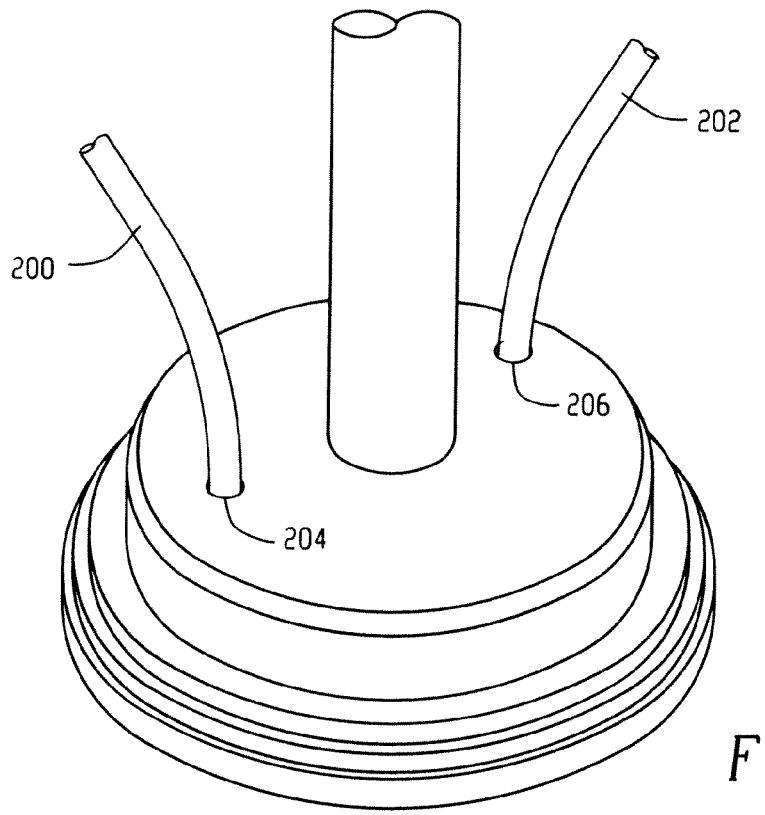
FIG. 4 is a perspective view of the assembled coupling arrangement between the LED and light guide of FIG. 2.

The coupling arrangement of FIGS. 2-4 is desirable because of the reduced cost, and ease of manufacture and assembly. The white or reflective surface of the support 170 along with the relative dimensioning between the planar end of the light guide over the perimeter wall 174 of the support provides good coupling efficiency on the order of 80%. The enlarged mass or volume of the heat sink 180 also contributes to maintaining the operating temperature of the red LED at a reduced level.

FIGS. 5 and 6 illustrate an alternative exemplary embodiment. The LED 140 is of the type that includes integrated optics; namely, an epoxy dome or lens 210, received over the LED that is mounted on substrate 212. The substantially planar or proximal end 152 of the light guide is interconnected with the LED assembly with a coupler 220. The coupler preferably has an inner reflective surface 222 that is in the shape or conformation of a paraboloid or aspheroid in which a narrow first end 224 of the reflector surface abuts along an interface between the outer perimeter 210 of the dome and an upper surface of substrate 212. The reflective surface then gradually widens along the parabolic or aspheric curve to second end 226 that has a stepped configuration dimensioned to receive a limited axial extent of the proximal end of the light guide.

The coupler 220 is preferably formed of a metal or alternative materials may be used as long as the inner reflector surface 222 is such as to direct the light from the LED into the proximal end of the light guide. The preferred reflector surface conformations are such that the light rays are directed toward a more collimated arrangement so that total internal reflection (TIR) through the extended length of the light guide results in a higher coupling efficiency between the LED and the light guide. The light ray trace is exhibited in FIG. 6 where light rays exiting the dome portion 210 of the LED assembly that contact the coupler are then directed at angles contributing toward total internal reflection.

In the embodiment of FIG. 5, the volume or cavity within the coupler and disposed between the dome of the LED assembly and the proximal end of the light guide is preferably air. Of course it is understood that the cavity could be filled with a material that has an index of refraction that closely matches the refractive index of the light guide.

FIGS. 7 and 8 illustrate an LED assembly that does not include the integrated optics of the type shown in FIG. 5. Instead, the bare LED chip 140 is shown on substrate 212 and coupler 320 is slightly modified in its dimensions but still serves to enhance the coupling efficiency between the LED and the light guide. More particularly, an inner reflector surface 322 has a first or narrow end portion 324 that is dimensioned to be closely received around the bare chip 140 of the LED, and terminates or abuts against an upper surface of substrate 212. The inner reflector surface preferably has a paraboloid or aspheroid conformation in this embodiment so that light emitted from the LED assembly adjacent to end 324 of the reflecting surface is directed toward the wider, stepped end 326 that receives a limited axial portion of the proximal end of the light guide. The light ray trace shown in FIG. 8 illustrates the advantages provided by the coupler 320 to enhance total internal reflection and encourage the light rays emitted from the LED assembly to enter into the light guide.

Figure 10:
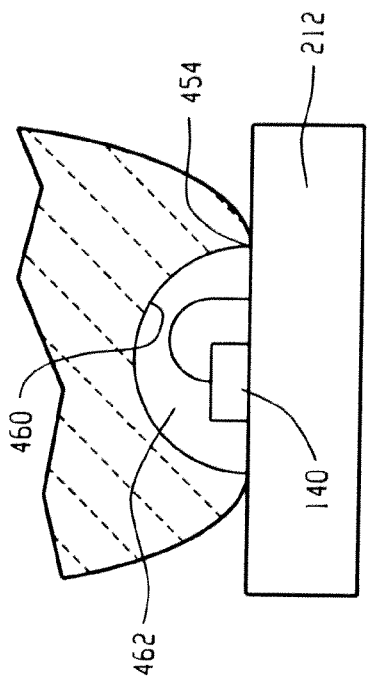
FIG. 10 is an enlarged view of the encircled portion of FIG. 9.
Figure 11:
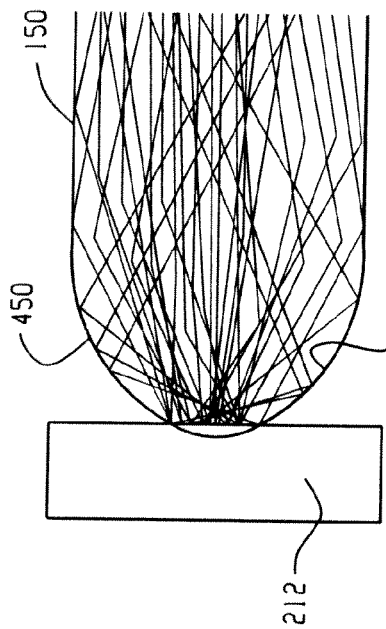
FIG. 11 is a light ray trace of the embodiment of FIGS. 9 and 10.
Figure 9:
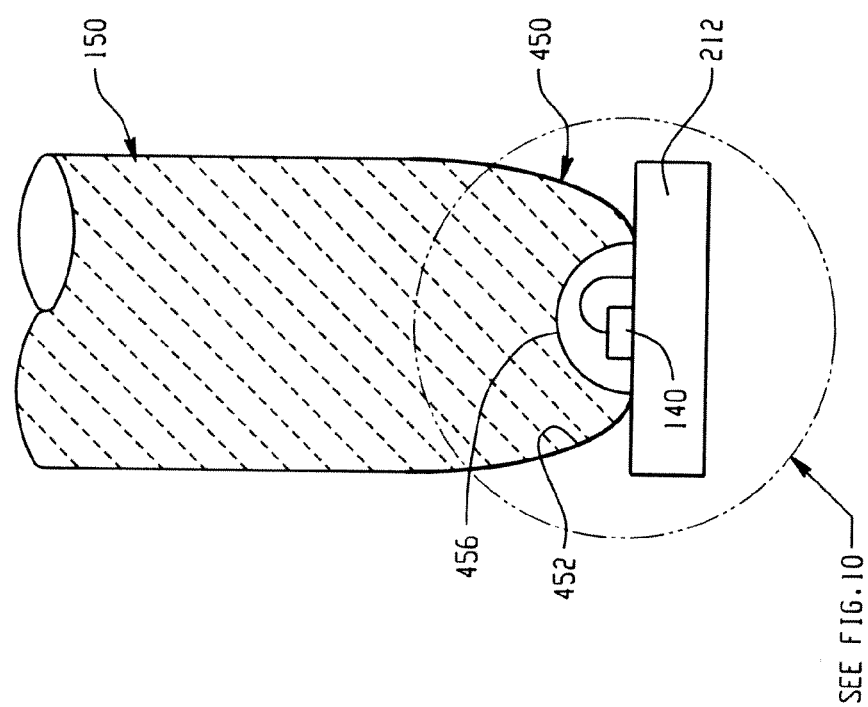
FIG. 9 is an elevational view, partly in cross-section, of another exemplary embodiment.

A slightly different embodiment is shown in FIGS. 9-11. Again, a bare LED chip 140 is shown on substrate 212. In this instance, a coupler is integrated into an end of the light guide 150. Particularly, end 450 of the light guide has an inner reflective surface 452 also preferably of a paraboloid or aspheroid conformation. The reflecting surface 452 extends from first end 454 to a second end 456 where the surface transitions into an outer diameter of a remainder of the light guide. As most evident in FIG. 10, the terminal end of the light guide has a hemispherical or dome shaped recess 460 that is dimensioned to accommodate the bare chip 140 that is located on a surface or top of substrate 212 of the LED assembly. The recess 460 terminates on the end of the light guide where the reflector surface 452 begins. In this manner, the reflector surface is brought into engagement with an upper surface of the substrate and circumferentially surrounds the LED to redirect light that extends out from 0-180 degrees from the LED chip and improve the coupling efficiency into the interior of the light guide. Again, these improved results are illustrated in FIG. 11 where a light ray trace exhibits substantial improvement for total internal reflection within the light guide. A cavity 462 surrounding the LED chip assembly 140 has an air gap or a material such as a gel with a refractive index that closely matches the refractive index of the light guide.

Substantial improvements in coupling efficiency have been achieved by using the coupling arrangements shown and described in the various embodiments. Rather than coupling efficiencies ranging from 35 to approximately 50%, the improved efficiencies range from approximately 70% to over 96% efficiency. A paraboloid or aspheroid mirrored surface is capable of substantially collimating the rays leaving the LED source in practically any direction. Further, filling the cavity about the LED with a transparent material that has a refractive index that closely matches that of the light guide has two advantages. First, the transparent material reduces the Fresnel reflections on the LED-to-air and the air-to-light guide interfaces. Second, the transparent material also makes possible the application of total internal reflection on the reflecting surface. A well collimated beam of light is achieved if the exit aperture is considerably larger than the source diameter or if a length of the paraboloid allows multiple reflections. By increasing the coupling-in efficiency, the desired effect of higher saturated red color rendering is achieved in the combination CFL while having the same energy consumption. Alternatively, the energy consumption of an LED can be lowered by keeping the same effect, and likewise increasing the efficiency of the combination lamp. Thus, a red LED consumes electrical power from 0.1 watts to 10 watts, and radiates 6-900 lumens of red light to a light guide having a diameter that ranges between 2 millimeters and 20 millimeters with an elongated shape. The preferred material of the light guide is a polymer or a glass, having a refractive index of 1.4 to 1.6 that effectively transfers light from the base of a CFL to the region of the discharge tube. Minimal loss of light is encountered in the region of the light guide below the plastic collar, i.e. within the shell of the base, and a maximum out-coupling is still required in the region of the discharge tubes. Present embodiments, however, address the coupling-in efficiency for different types of LEDs, i.e. those equipped or not equipped with a primary or integrated optics or lens.

The disclosure has been described with reference to the preferred embodiments. Obviously modification and alterations will occur to others upon reading and understanding the preceding detailed description. It is intended that the disclosure includes all such modifications and alterations.

We claim:

1. An apparatus for coupling a light emitting diode (LED) to a light guide and adapted to mount within a base of a compact fluorescent lamp (CFL) assembly, the apparatus comprising:

an LED for emitting light in at least a first direction;

a light guide having a proximal end positioned adjacent the LED for receiving light emitted therefrom, and a distal end remotely spaced from the proximal end from which light exits the light guide; and a coupler interposed between the LED and the proximal end of the light guide for transferring a high ratio of light from the LED to the light guide, the coupler including one of a parabolic or aspheric inner reflector surface having a narrow first end at least partially encompassing the LED and a wide second end that at least partially encompasses the proximal end of the light guide.

2. The apparatus of claim 1 wherein the first end of the coupler encompasses the bare LED chip.

3. The apparatus of claim 2 wherein the inner reflector surface extends from a substrate surface of the bare LED chip.

4. The apparatus of claim 3 wherein the inner reflector surface surrounds a perimeter of the chip received on the substrate.

5. The apparatus of claim 2 wherein a cavity formed by the inner reflector surface is filled with gel between the bare LED chip and the proximal end of the light guide.

6. The apparatus of claim 5 wherein the gel has a refractive index of 1.52 that closely matches the refractive index of 1.5 of the light guide.

7. The apparatus of claim 1, further including a fixture having a recess dimensioned for closely receiving a limited axial length of a perimeter portion of the light guide and the coupler.

8. An apparatus for coupling a light emitting diode (LED) to a light guide comprising:
an LED for emitting light in at least a first direction;
a light guide having a proximal end positioned adjacent the LED for receiving light emitted therefrom, and a distal end remotely spaced from the proximal end from which light exits the light guide such that a lateral dimension of the light guide is substantially greater than a lateral dimension of the LED; and
a coupler integrally formed in the proximal end of the light guide for transferring a high ratio of light from the LED to the light guide, the coupler including one of a parabolic or aspheric shaped surface having a narrow first end at least partially encompassing the LED and a wide second end that merges into a remainder of the light guide.

9. The apparatus if claim 8 wherein the apparatus is adapted to mount within a base of a compact fluorescent lamp (CFL) assembly.

10. The apparatus of claim 9, wherein the lateral dimension of the LED is approximately 1/10 of the lateral dimension of the light guide to assure coupling of light emitted from the LED into the light guide.

11. The apparatus of claim 8 wherein a cavity is formed by the parabolic or aspheric shaped surface and is filled with gel between the LED and the proximal end of the light guide.

12. An apparatus for coupling a light emitting diode (LED) to a light guide comprising:
an LED for emitting light in at least a first direction;
a light guide having a proximal substantially planar end positioned adjacent the LED for receiving light emitted therefrom, and a distal end remotely spaced from the proximal end from which light exits the light guide;
a support receiving the LED on a central recessed portion of a first surface thereof disposed in facing relation to the proximal planar end of the light guide, the support having a reflector surface for transferring a high ratio of light from the LED to the light guide; and
a fixture having a recess dimensioned for closely receiving a limited axial length of a perimeter portion of the light guide.

13. The apparatus of claim 12 wherein the proximal substantially planar end of the light guide abuttingly engages a raised peripheral portion of the support in surrounding relation to the LED.

14. The apparatus of claim 13 wherein a remainder portion of the recess is filled with air.

15. The apparatus of claim 12 wherein the fixture includes at least one opening for receiving power supply therethrough.

16. The apparatus of claim 12 further comprising a heat sink having a recess that supports the fixture and support therein.

17. The apparatus of claim 12 wherein a lateral dimension of the LED is approximately 1/10 of a lateral dimension of the proximal substantially planar end of the light guide to assure coupling of light emitted from the LED into the light guide.

18. The apparatus if claim 12 wherein the apparatus is adapted to mount within a base of a compact fluorescent lamp (CFL) assembly.

* * * * *